United States Patent [19]

O'Connor

[11] Patent Number: 4,568,844
[45] Date of Patent: Feb. 4, 1986

[54] FIELD EFFECT TRANSISTOR INVERTER-LEVEL SHIFTER CIRCUITRY

[75] Inventor: Kevin J. O'Connor, Center Valley, Pa.

[73] Assignee: AT&T Bell Laboratories, Murray Hill, N.J.

[21] Appl. No.: 467,215

[22] Filed: Feb. 17, 1983

[51] Int. Cl.[4] .............. H03K 19/003; H03K 19/094; H03K 17/10
[52] U.S. Cl. .................................. 307/475; 307/450; 307/584
[58] Field of Search .............. 307/475, 450, 451, 452, 307/581, 582, 583, 584, 585, 571, 264, 579

[56] References Cited

U.S. PATENT DOCUMENTS

| | | | |
|---|---|---|---|
| 3,675,144 | 9/1969 | Zuk | 307/475 X |
| 3,739,194 | 6/1973 | Freeman et al. | 307/296 X |
| 4,096,584 | 6/1978 | Owen et al. | 307/264 X |
| 4,109,163 | 8/1978 | Cricchi et al. | 307/264 X |
| 4,161,663 | 7/1979 | Martinez | 307/264 |
| 4,346,310 | 8/1982 | Carter | 307/264 |
| 4,396,845 | 8/1983 | Nakano | 307/475 |
| 4,437,025 | 3/1984 | Liu et al. | 307/475 |
| 4,438,352 | 3/1984 | Mardkha | 307/475 |
| 4,469,960 | 9/1984 | Raghunathan | 307/475 X |
| 4,475,050 | 10/1984 | Noufer | 307/579 X |

FOREIGN PATENT DOCUMENTS

13852 2/1978 Japan ................................. 307/475

OTHER PUBLICATIONS

Fink et al., *Electronics Engineers' Handbook*, pp. 16-15 to 16-19, 1982.

*Primary Examiner*—Stanley D. Miller
*Assistant Examiner*—David R. Bertelson
*Attorney, Agent, or Firm*—David I. Caplan

[57] ABSTRACT

A field effect transistor inverter-level shifter circuit which accepts TTL input level signals and generates MOS output level signals consists of the series combination of a load device, an enhancement mode transistor, and a depletion mode transistor. The gates of the enhancement and depletion mode transistors are connected to an input terminal. The source of the enhancement transistor is connected to the drain of the depletion transistor. The depletion transistor acts to control the potential of the source of the enhancement transistor so as to allow it to tolerate worse case TTL input potential "0" levels while not becoming more than only weakly biased on.

15 Claims, 1 Drawing Figure

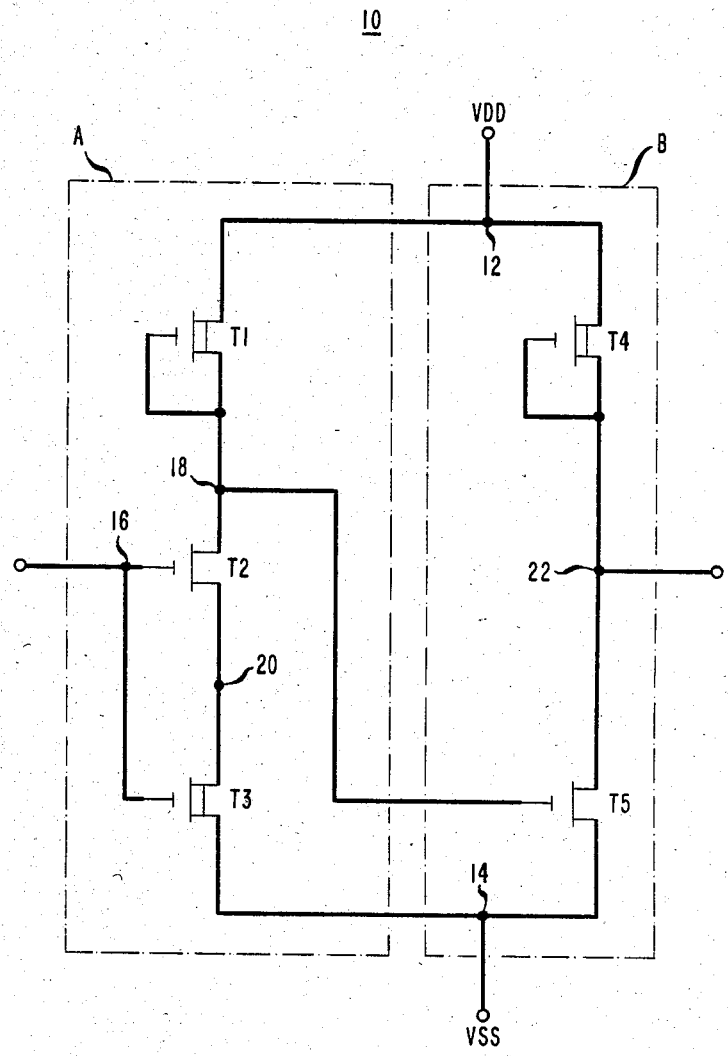

FIELD EFFECT TRANSISTOR INVERTER-LEVEL SHIFTER CIRCUITRY

TECHNICAL FIELD OF INVENTION

This invention relates to logic circuitry and in particular to field effect transistor inverter-level shifter and buffer-level shifting circuitry.

BACKGROUND OF THE INVENTION

One typical field effect transistor inverter circuit uses the combination of a load device and a switching device with the drain of the load device connected to a first power supply VDD, the source of the load device and the drain of the switching device connected to an output terminal, the gate of the switching device connected to an input terminal, and the source of the switching device connected to a second power supply VSS. For n-channel devices, VDD is typically +5.0 volts, VSS is typically 0 volts (ground potential), the threshold voltage of the switching device is approximately +1.0 volt, and the impedance of the load device is substantially greater than the impedance of the switching device. An applied "1" input logic state having a potential level near +5.0 volts causes both devices to conduct and the output potential level to be close to 0 volts, a "0". An applied "0" input logic state having a potential close to 0 volts causes the switching device to be biased off, and the output potential level to be at or close to +5.0 volts, a "1". If the input "0" level is +1.4 volts, as might be the case of some worse case input "0" signal received from a TTL circuit, the impedance ratio of the two devices must be modified or the threshold voltage or the switching device must be modified to obtain the desired inversion function. Such an impedance ratio modification causes the "0" output potential level to increase and thus reduces operating noise margins. In addition, it degrades the output fall time. Modification of the threshold voltage can be acommplished by adding an ion implantation step to the fabrication process which increases the complexity thereof and thereby potentially decreases yield and increases cost.

It would be desirable to have a field effect transistor inverter-level shifter circuit which can accept input "0" levels of a magnitude above the threshold voltage of the switching device but does not suffer a significant increase in the output "0" potential level or require an extra processing step to modify the threshold voltage of the switching device.

SUMMARY OF THE INVENTION

The present invention is directed to circuitry comprising a load device and first and second field effect transistors. A first terminal of the load device is connectable to a first potential source, and a second terminal of the load device is coupled to the drain of the first transistor. The gate and source of the first transistor are coupled to the gate and drain, respectively, of the second transistor. The source of the second transistor is connectable to a second potential source. A circuitry input terminal is coupled to the gates of the first and second transistors. The second terminal of the load device and the drain of the first transistor serve as the circuitry output terminal.

The circuitry functions to provide at the output terminal an inversion and level shifting of logic levels applied to the input terminal. The conductivity of the second transistor is modulated by an applied input signal and acts to control the potential of the source of the first transistor such that the first transistor does not substantially conduct even though the input potential on the gate terminal thereof has a magnitude greater than the magnitude of the threshold voltage of the first transistor. This allows for higher input "0" logic potential levels than is the case if the second transistor is not used. Accordingly, TTL logic levels can be tolerated while maintaining useful noise margins and response time. The output signal levels of the circuitry are close enough to standard MOS levels such that a standard field effect transistor inverter circuit can be coupled by an input thereof to the output of the circuitry, and true MOS potential levels are generated at the output of the standard inverter circuit.

Viewed from another aspect, the present invention is directed to circuitry comprising a load device, a first field effect transistor having a drain coupled to the load device and having a gate coupled to a circuitry input terminal, and control circuit means having a control terminal coupled to the circuitry input terminal and having a first terminal. The control circuit means is characterized by an impedance coupled to the first terminal thereof which varies as a function of the potential level of input signals applied to the control terminal thereof. An input "0" level applied to the circuitry input terminal results in a greater impedance than an input "1" level such that with an applied input "0" level, the first transistor tends to only become essentially no more than weakly biased on, and with an applied input "1" level, the first transistor becomes heavily biased on.

These and other features and advantages of the invention are better understood from a consideration of the following drawing taken in conjunction with the accompanying drawing.

BRIEF DESCRIPTION OF THE DRAWING

The FIGURE illustrates in electrical schematic form one embodiment in accordance with the invention.

DETAILED DESCRIPTION

Referring now to the FIGURE, there is illustrated a buffer-level shifter circuitry 10 which comprises a first inverter-level shifter stage illustrated within dashed line rectangle A and a second inverter-level shifter stage illustrated within dashed line rectangle B. Stage A is in accordance with the present invention and comprises depletion mode field effect transistors T1 and T3 and enhancement mode field effect transistor T2. Stage B is well known in the art and comprises depletion mode field effect transistor T4 and enhancement mode field effect transistor T5. The inclusion of T3 in inverter stage A effectively results in T2 being able to become only weekly biased on when "0" level signals are applied to input terminal 16 which have a magnitude greater than the threshold voltage of T2. This permits input "0" logic signals to have substantially higher potential levels than can be tolerated by conventional field effect transistor inverter stages such as stage B. T3 acts as a control circuit or control circuit means which selectively increases the potential on the source of T2 so as to control T2's gate-to-source voltage and thus control conduction through T2. Circuitry 10 can thus accept conventional TTL input logic signal potential levels (typically 0 to +1.4 volts) and produce output potential levels which are essentially the same as produced by conventional field effect transistor buffer circuits.

An input terminal 16 of circuitry 10 is coupled to the gates of T2 and T3. T1, which acts as a load device, has the gate and source thereof coupled to the drain of T2, to the gate of T5, and to a node 18. The source of T2 is coupled to the drain of T3 and to a node 20. T4, which acts as a load device, has the gate and source thereof coupled to the drain of T5 and to a circuitry output terminal 22. The drains of T1 and T4 are coupled together to a terminal 12 and to a power supply VDD which may be referred to as a potential source. The sources of T3 and T5 are coupled together to a terminal 14 and to a second power supply VSS, which is typically, but not necessarily, ground potential (0 volts). VSS may be referred to as a potential source. The gate and source of T1 and the drain of T2 serve as the output node or terminal of stage A, and the gate of T5 serves as an input node or terminal of stage B.

For the purposes of illustration, T1, T3, and T4 are assured to be depletion mode n-channel insulated gate field effect transistors, T2 and T5 are enhancement mode field effect transistors having a threshold potential of +0.5 volt, VDD=+3.0 volts, and VSS=0 volts. An input "0" logic signal applied to input terminal 16 is assumed to have a potential level of from 0 to +1.4 volts, and an input "1" logic signal applied to input terminal 16 is assumed to have a potential level of +1.8 to 3.0 volts.

With an input "1" applied to input terminal 16, T2 is biased on and T3, which is essentially always biased on, becomes highly conductive. As current begins to flow from T1 through T2, and then through T3, the potential of node 20 increases somewhat above VSS, but does not increase sufficiently so as to cause the gate-to-source voltage of T2 to become less than the threshold voltage thereof. Thus, T2 is biased on heavily and conducts. The ratio of the impedance of T1 versus T2 and T3 is selected such that with an input "1" signal applied to terminal 16, the potential of node 18 is +0.4 volt or less positive, an output "0", for stage A. A +0.4 volt signal at the gate of T5 biases T5 off and results in output terminal 22 assuming a potential of approximately +3.0 volts, a "1" output signal.

With an input "0" logic signal having a potential of +1.4 volts applied to input terminal 16, T3 is conductive, but not as conductive as when the potential level of the input signal is at +1.8 volts or more positive. T2 becomes weakly biased on, and a relatively low level of conduction is established through T1, T2, and T3. T3 has sufficient impedance at this bias level such that the current flow therethrough produces a potential at node 20 which is sufficiently positive to assure that T2 is essentially only weakly biased on. T2 is ideally biased off at this time. This results in a output "1" at node 18 which has a potential level of approximately +2.75 volts. The impedance of T4 is designed to be significantly higher than the impedance of T5 when both are biased on and conducting, as is the case when a "1" signal is applied to the gate of T5. A +2.75 volt signal applied to the gate of T5 causes T5 to be heavily biased on and thereby causes conduction through T4 and T5. This results in output terminal 22 being at +0.2 volt, a "0" output level.

It is thus apparent that a "0" input signal having a potential level up to +1.4 volts results in a "0" output signal having a potential level of +0.2 volt and that a "1" input signal having a potential level as low as +1.8 volts results in an output signal "1" having a potential level of +3.0 volts. Accordingly, circuitry 10 performs a buffer-level shifting function with stage A providing a first inversion-level shifting function and with stage B providing a second inversion-level shifting function. The net result is that TTL input logic levels are shifted to MOS logic levels, and input signals applied to input terminal 16 are isolated from load capacitance (not illustrated) on output terminal 22.

Stage A has been fabricated as the first stage of an input address buffer of a 4096 bit static field effect transistor random access memory. Stage A has been tested and found to be fully functional. The channel lengths (in microns) and widths (in microns) of T1, T2, and T3 are 1.25, 1.0, and 1.25, and 54, 90, and 18, respectively. Circuitry 10 has also been fabricated as a buffer-level shifter circuit which is part of the above-described memory and which receives an input signal from a sense amplifier of the memory. Circuitry 10 has been tested and found to be fully functional. The channel lengths (in microns) and widths (in microns) of T1, T2, T3, T4, and T5 are 1.0, 1.25, 1.0, 1.0, and 1.25, and 4, 20, 12, 3, and 9, respectively.

The embodiments described herein are intended to be illustrative of the general principles of the present invention. Various modifications are possible, consistent with the spirit of the invention. For example, p-channel field effect transistors can be substituted for the n-channel transistors, provided power supply levels and input logic levels are appropriately modified. Still further, depletion mode transistor T3 can be replaced by an enhancement transistor, providing the impedance thereof is properly selected. Still further, T1 can be replaced by a variety of load devices, including a resistor. Still further, stage B can be replaced with many well-known inverter stages. Still further, appropriate changes in impedance levels of the transistors, and the magnitudes of the power supplies, can facilitate the use of the circuitry to detect relatively small signal differences such as are common with emitter-coupled logic circuits or other logic families. Still further, circuitry 10 can be fabricated in CMOS with T1 and T4 being p-channel transistors and T2, T3, and T5 being n-channel transistors or with T1 and T4 being n-channel transistors and T2, T3, and T5 being p-channel transistors.

What is claimed is:

1. Circuitry comprising:
   a load device having first and second terminals, the first terminal being connectable to a first potential source and the second terminal serving as an output node;
   a first field effect transistor having its drain terminal coupled to the second terminal of the load device and having its gate terminal conductively ohmically coupled to a circuitry input terminal; and
   a second field effect transistor having its drain terminal coupled to, and only to, the source terminal of the first transistor, and having its gate terminal coupled to the gate terminal of the first transitor, and having its source terminal connectable to a second potential source, the first transistor being enhancement mode and the second transistor being depletion mode.

2. The circuitry of claim 1 wherein the load device is a third field effect transistor with its source terminal coupled to its gate terminal.

3. The circuitry of claim 2 wherein the third field effect transistor is a depletion mode transistor which has its gate and source terminals coupled to the drain of the first transistor and has its drain terminal connectable to the first potential source.

4. The circuitry of claim 3 further comprising an inverter having an input terminal coupled to the output node and having an output terminal.

5. The circuitry of claim 4 wherein:
the inverter comprises fourth and fifth field effect transistors which are a depletion mode and an enhancement mode transistor, respectively, and
the gate terminal of the fifth transistor serves as the input terminal of the inverter, and the gate and source terminals of the fourth transistor and the drain terminal of the fifth transistor are coupled to the output terminal of the inverter.

6. The circuitry of claim 5 wherein all transistors are n-channel type insulated gate field effect transistors.

7. The circuitry of claim 6 wherein the fifth transistor is enhancement mode and the fourth transistor is deletion mode.

8. The circuitry of claim 5 wherein all transistors are p-channel type insulated gate field effect transistors.

9. The circuitry of claim 8 wherein the fifth transistor is enhancement mode and the fourth transistor is deletion mode.

10. The circuitry of claim 5, wherein the first, second, and fifth transistors are n-channel insulated gate field effect transistors, and the third and fourth transistors are p-channel insulated gate field effect transistors.

11. The circuitry of claim 5 wherein the first, second, and fifth transistors are p-channel insulated gate field effect transistors, and the third and fourth transistors are n-channel insulated gate field effect transistors.

12. In a level-shifting circuit
(a) first and second field effect transistors, each having a separate gate, source, and drain terminal, the second transistor having its drain terminal coupled to, and only to, the source terminal of the first transistor, and the second transistor having its source terminal connectable to a potential source;
(b) a load device;
(c) conducting means for coupling the drain terminal of the first transistor to the load device, whereby a first node is formed between the load device and the first transistor along the first conducting means, the first transistor being enhancement mode and the second transistor being depletion mode; and
(d) a circuit input node, for receiving input signals to be level shifted, conductively ohmically coupled both to the gate terminal of the first transistor and to the gate terminal of the second transistor, whereby in response to the input signals being applied to the circuit input terminal there are developed inverted signals at the first node.

13. The circuit of claim 12 in which the first and second transistors are insulated gate field effect transistors.

14. The circuit of claim 13 further comprising an inverter connected for receiving and inverting the inverted signals to produce level-shifted output signals.

15. The circuit of claim 12 further comprising an inverter connected for receiving and inverting the inverted signals to produce level-shifted output signals.

* * * * *

UNITED STATES PATENT AND TRADEMARK OFFICE
CERTIFICATE OF CORRECTION

PATENT NO. : 4,568,844

DATED : February 4, 1986

INVENTOR(S) : Kevin J. O'Connor

It is certified that error appears in the above-identified patent and that said Letters Patent is hereby corrected as shown below:

Column 4, line 58, "transitor" should read --transistor--.

Column 4, line 61, "and" should be omitted.

Signed and Sealed this

Sixth Day of January, 1987

Attest:

DONALD J. QUIGG

Attesting Officer

Commissioner of Patents and Trademarks